US012794424B2

(12) United States Patent
Lee

(10) Patent No.: US 12,794,424 B2
(45) Date of Patent: Nov. 10, 2026

(54) CASCODE AMPLIFIER CIRCUIT

(71) Applicant: Skyworks Solutions, Inc., Irvine, CA (US)

(72) Inventor: Yong Hee Lee, Tustin, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 746 days.

(21) Appl. No.: 18/166,951

(22) Filed: Feb. 9, 2023

(65) Prior Publication Data

US 2023/0268894 A1 Aug. 24, 2023

Related U.S. Application Data

(60) Provisional application No. 63/308,873, filed on Feb. 10, 2022.

(51) Int. Cl.
*H03F 1/22* (2006.01)
*H03F 1/56* (2006.01)
*H03F 3/24* (2006.01)

(52) U.S. Cl.
CPC ............... *H03F 3/245* (2013.01); *H03F 1/22* (2013.01); *H03F 1/565* (2013.01); *H03F 2200/15* (2013.01); *H03F 2200/451* (2013.01); *H03F 2200/78* (2013.01)

(58) Field of Classification Search
CPC . H03F 3/245; H03F 3/195; H03F 1/22; H03F 1/565; H03F 1/0261; H03F 1/223; H03F 2200/15; H03F 2200/451; H03F 2200/78; H03F 2200/18
USPC .............................................. 330/296, 9, 311
See application file for complete search history.

(56) References Cited

U.S. PATENT DOCUMENTS

| | | | | |
|---|---|---|---|---|
| 7,629,853 | B2 * | 12/2009 | Oishi | H03F 1/301 330/273 |
| 8,228,125 | B2 * | 7/2012 | Heijden | H03F 1/0266 330/311 |
| 8,779,859 | B2 * | 7/2014 | Su | H03F 3/193 330/311 |
| 10,291,194 | B2 * | 5/2019 | Ilkov | H03F 1/565 |
| 10,581,384 | B2 | 3/2020 | Lee et al. | |
| 11,374,543 | B2 | 6/2022 | Lee | |
| 2002/0074319 | A1 | 6/2002 | Wilbur et al. | |
| 2002/0101287 | A1 | 8/2002 | Fowler | |
| 2002/0135426 | A1 | 9/2002 | Choi | |
| 2003/0006845 | A1 | 1/2003 | Lopez et al. | |
| 2003/0112078 | A1 | 6/2003 | Rategh et al. | |
| 2004/0130436 | A1 | 7/2004 | Wilbur et al. | |
| 2005/0052224 | A1 | 3/2005 | Yang et al. | |
| 2005/0231273 | A1 | 10/2005 | Whittaker | |
| 2007/0001766 | A1 | 1/2007 | Ripley et al. | |
| 2007/0291930 | A1 | 12/2007 | Apfel et al. | |

(Continued)

*Primary Examiner* — Andrea Lindgren Baltzell
*Assistant Examiner* — Nareh Shamiryan
(74) *Attorney, Agent, or Firm* — VIA LLP

(57) ABSTRACT

A cascode amplifier circuit comprising a power amplifier block having a first transistor and a second transistor. The amplifier circuit also comprises: a bias generator block coupled to the first transistor and being configured to provide a reference voltage to the power amplifier block; and a current control block coupled to the second transistor of the power amplifier block, the current control block being configured to adjust a gate bias to the second transistor of the power amplifier block to maintain a constant quiescent current.

20 Claims, 7 Drawing Sheets

(56) References Cited

U.S. PATENT DOCUMENTS

| | | | |
|---|---|---|---|
| 2008/0007341 | A1 | 1/2008 | Ripley et al. |
| 2011/0300898 | A1 | 12/2011 | Homol et al. |
| 2015/0207475 | A1 | 7/2015 | Roy et al. |
| 2016/0056778 | A1 | 2/2016 | Blum et al. |
| 2016/0190996 | A1 | 6/2016 | Searle et al. |
| 2016/0191001 | A1 | 6/2016 | Ripley et al. |
| 2016/0191002 | A1 | 6/2016 | Ripley et al. |
| 2016/0191086 | A1 | 6/2016 | Ripley et al. |
| 2016/0197586 | A1 | 7/2016 | Ripley |
| 2016/0241194 | A1 | 8/2016 | Lehtola |
| 2016/0241195 | A1 | 8/2016 | Lehtola et al. |
| 2016/0241202 | A1 | 8/2016 | Lehtola et al. |
| 2016/0241210 | A1 | 8/2016 | Andrys et al. |
| 2016/0248389 | A1 | 8/2016 | Lehtola et al. |
| 2017/0026005 | A1 | 1/2017 | Ripley et al. |
| 2017/0133988 | A1 | 5/2017 | Rogers |
| 2017/0149390 | A1 | 5/2017 | Rogers et al. |
| 2017/0244368 | A1 | 8/2017 | Blum |
| 2017/0244372 | A1 | 8/2017 | Roy et al. |
| 2017/0250727 | A1 | 8/2017 | Roy et al. |
| 2017/0302230 | A1 | 10/2017 | Lehtola et al. |
| 2017/0317653 | A1 | 11/2017 | Lehtola et al. |
| 2017/0331434 | A1 | 11/2017 | Searle |
| 2018/0054166 | A1 | 2/2018 | Pehlivanoglu |
| 2018/0054171 | A1 | 2/2018 | Pehlivanoglu |
| 2018/0062580 | A1 | 3/2018 | Rogers |
| 2018/0076774 | A1 | 3/2018 | Pehlke et al. |
| 2018/0097483 | A1 | 4/2018 | Lehtola |
| 2018/0138873 | A1 | 5/2018 | Arell |
| 2018/0183389 | A1 | 6/2018 | Lehtola et al. |
| 2018/0233578 | A1 | 8/2018 | Shi et al. |
| 2018/0248523 | A1 | 8/2018 | Rogers |
| 2018/0294779 | A1 | 10/2018 | Allen |
| 2018/0294781 | A1 | 10/2018 | Rogers |
| 2019/0028078 | A1 | 1/2019 | Lee et al. |
| 2019/0097591 | A1 | 3/2019 | Pehlivanoglu |
| 2019/0123690 | A1 | 4/2019 | Balteanu et al. |
| 2019/0123699 | A1 | 4/2019 | Andrys et al. |
| 2019/0131936 | A1 | 5/2019 | Blum |
| 2019/0149099 | A1 | 5/2019 | Lehtola |
| 2019/0158028 | A1 | 5/2019 | Pehlivanoglu |
| 2019/0158046 | A1 | 5/2019 | Lehtola et al. |
| 2019/0229688 | A1 | 7/2019 | Lehtola |
| 2020/0091870 | A1 | 3/2020 | Lehtola et al. |
| 2020/0099346 | A1 | 3/2020 | Lehtola et al. |
| 2020/0106405 | A1 | 4/2020 | Lehtola |
| 2020/0112289 | A1 | 4/2020 | Rogers |
| 2020/0145039 | A1 | 5/2020 | Hageraats et al. |
| 2020/0162029 | A1 | 5/2020 | Pehlke et al. |
| 2020/0162032 | A1 | 5/2020 | Ripley et al. |
| 2020/0162039 | A1 | 5/2020 | Lehtola et al. |
| 2020/0366256 | A1 | 11/2020 | Pehlivanoglu |
| 2021/0104983 | A1 | 4/2021 | Rogers |
| 2021/0104989 | A1 | 4/2021 | Lehtola et al. |
| 2021/0111679 | A1 | 4/2021 | Andrys et al. |
| 2021/0126598 | A1 | 4/2021 | Rogers |
| 2021/0151582 | A1 | 5/2021 | Shi et al. |
| 2021/0159860 | A1 | 5/2021 | Pehlivanoglu |
| 2021/0175916 | A1 | 6/2021 | Pehlivanoglu |
| 2021/0218433 | A1 | 7/2021 | Liang et al. |
| 2021/0384875 | A1 | 12/2021 | Lyain et al. |
| 2022/0014155 | A1 | 1/2022 | Ripley et al. |
| 2022/0149788 | A1 | 5/2022 | Al-Shyoukh |
| 2022/0255514 | A1 | 8/2022 | Lehtola |
| 2022/0278707 | A1 | 9/2022 | Liang et al. |
| 2023/0012894 | A1 | 1/2023 | Liang et al. |
| 2023/0014555 | A1 | 1/2023 | Liang et al. |
| 2023/0030709 | A1 | 2/2023 | Hageraats et al. |
| 2023/0102120 | A1 | 3/2023 | Thompson et al. |
| 2023/0112435 | A1 | 4/2023 | Abadi et al. |

* cited by examiner

CASCODE AMPLIFIER CIRCUIT

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

Embodiments of the invention relate to an amplifier circuit, and in particular a cascode power amplifier circuit, as well as a method for bias generation for a cascode amplifier circuit.

Description of the Related Technology

Power amplifier circuits are implemented in electronic devices. Existing bias circuits for power amplifiers exhibit large variation of current across a range of battery voltages. Particularly for CMOS power amplifiers, adjusting drain source voltage for a cascode power amplifier core is critical as it the amplifier can break easily without proper voltage drain source. In order to provide optimal bias and adjust voltage drain source, existing circuits are complicated and utilize a voltage detector and look up table. Such existing circuits also cannot eliminate process variation.

An example circuit according to the prior art is illustrated in FIG. 1. FIG. 1 illustrates a cascode amplifier circuit 100 for a complementary metal oxide semiconductor (CMOS) amplifier. The amplifier circuit 100 comprises a power amplifier block 101. The power amplifier block 101 receives an input voltage $V_{cc}$ from a battery 103. The power amplifier block 101 comprises a first transistor 105 and a second transistor 107, with a voltage drain $V_{d2}$ between the first and second transistors. The power amplifier block 101 also comprises a matching circuit 117.

The power amplifier block 101 receives a bias voltage from a cascode bias generator 109. A resistor 111 couples the cascode bias generator 109 with the power amplifier block 101. In order to determine the voltage drain $V_{d2}$, the behaviour of the transistors must be characterized and the voltage over the resistor 111 must be calculated. A lookup table can then be used in order to control the drain voltage $V_{d2}$. This is a complex process. Since $V_{d2}$ cannot be reliably predicted, more process variation may be introduced. If one device, such as a transistor, has too much voltage drop, the component will be more easily broken.

A current mirror block 113 is coupled to the power amplifier block 101 via a resistor 115. The current mirror block 113 applies a gate voltage to the second transistor 107 (the transconductance ($g_m$ core)) directly. In a CMOS amplifier, the current is a function of the gate voltage at the second transistor, as well as the drain source voltage $V_{d2}$. The current mirror provides the gate voltage to the second transistor based on a 0V drain source 119.

The amplifier circuit 100 cannot tailor for process variation. That is, the current is a function of the gate voltages, but this changes between devices depending on component characteristics. If the voltage at the bias generator 109 is adjusted to adjust the drain voltage $V_{d2}$, the current is also changed. This changes process by process, and device by device.

SUMMARY

Inventors of the present invention have appreciated the need for an amplifier circuit, and particularly a cascode amplifier circuit, capable of generating optimum bias across a wide battery voltage range, whilst increasing the accuracy of voltage setting and tailoring for process variation.

According to one embodiment, there is provided a cascode amplifier circuit comprising: a power amplifier block having a first transistor and a second transistor; a bias generator block coupled to the first transistor and being configured to provide a reference voltage to the power amplifier block; and a current control block coupled to the second transistor of the power amplifier block, the current control block being configured to adjust a gate bias to the second transistor of the power amplifier block to maintain a constant quiescent current.

In one example, the bias generator block may be a cascode bias generator block and may be configured to: receive an input voltage; process the input voltage; and provide the reference voltage based on the processed input voltage.

In one example, the cascode bias generator circuit may further comprise an adder configured to add an offset voltage when processing the input voltage.

In one example, the power amplifier block may be a first power amplifier block, and the cascode amplifier circuit may further comprise a second power amplifier block having a third transistor and a fourth transistor, the bias generator block being coupled to the third transistor and being configured to provide the reference voltage to the second power amplifier block, and the current control block being coupled to the fourth transistor and being configured to adjust a gate bias to the fourth transistor based on a drain voltage between the third and fourth transistors.

In one example, the bias generator block may be coupled to the first and third transistors via a comparator configured to: compare the reference voltage with the drain voltage between the third and fourth transistors; and adjust a gate voltage provided to the first and third transistors to make the drain voltage between the third and fourth transistors and a drain voltage between the first and second transistors equal to the reference voltage.

In one example, the current control block may be coupled to the second and fourth transistors via a comparator configured to: compare the drain voltage between the third and fourth transistors with a quiescent voltage provided to the current control block; and adjust the gate voltage to the second and fourth transistors based on the comparison to maintain a constant quiescent current.

In one example, the power amplifier block may comprise a matching circuit.

In one example, the bias generator block may be coupled to the first transistor via a first resistor, and the current control block may be coupled to the second transistor via a second resistor, the first and second resistors being configured to prevent radio frequency (RF) swing.

In one example, the bias generator block may comprise a constant voltage source configured to provide a constant voltage to the power amplifier block.

According to one embodiment, there is provided a radio frequency module comprising: a cascode amplifier circuit having: a power amplifier block configured to provide a radio frequency signal, the power amplifier block including a first transistor and a second transistor; a bias generator block coupled to the first transistor and being configured to provide a reference voltage to the power amplifier block;

and a current control block coupled to the second transistor of the power amplifier block, the current control block being configured to adjust a gate bias to the second transistor of the power amplifier block to maintain a constant quiescent current; and a filter configured to filter the radio frequency signal.

According to one embodiment, there is provided a wireless communication device comprising a cascode amplifier circuit having: a power amplifier block configured to provide a radio frequency signal, the power amplifier block including a first transistor and a second transistor; a bias generator block coupled to the first transistor and being configured to provide a reference voltage to the power amplifier block; and a current control block coupled to the second transistor of the power amplifier block, the current control block being configured to adjust a gate bias to the second transistor of the power amplifier block to maintain a constant quiescent current.

According to one embodiment, there is provided a method for bias generation for a cascode amplifier circuit, the method comprising: a bias generator block coupled to a first transistor of a power amplifier block providing a reference voltage to the power amplifier block; and a current control block coupled to a second transistor of the power amplifier block adjusting a gate bias to the second transistor of the power amplifier block to maintain a constant quiescent current.

In one example, the bias generator block may be a cascode bias generator block and the method may further comprise the cascode bias generator block: receiving an input voltage; processing the input voltage; and providing the reference voltage based on the input voltage.

In one example, the processing the input voltage may comprise an adder of the case bias generator circuit adding an offset voltage to the input voltage.

In one example, the power amplifier block may be a first power amplifier block and the cascode amplifier circuit may comprise a second power amplifier block having a third transistor and a fourth transistor, the method further comprising: the bias generator block coupled to the second power amplifier block providing the reference voltage to the second power amplifier block; and the current control block coupled to the second power amplifier block adjusting a gate bias to the fourth transistor based on a drain voltage between the third and fourth transistors.

In one example, the method may further comprise: comparing, by a comparator coupling the bias generator block to the first and third transistors, the reference voltage with the drain voltage between the third and fourth transistors; and adjusting a gate voltage provided to the first and third transistors to make the drain voltage between the third and fourth transistors and the drain voltage between the first and second transistors equal to the reference voltage.

In one example, the method may further comprise: comparing, by a comparator coupling the current control block to the second and fourth transistors, the drain voltage between the third and fourth transistors with a quiescent voltage provided to the current control block; and adjusting the gate voltage to the second and fourth transistors based on the comparison to maintain a quiescent current.

In one example, the power amplifier block may comprise a matching circuit.

In one example, the method may further comprise using a first resistor coupling the bias generator block to the first transistor and a second resistor coupling the current control block to the second transistor to prevent radio frequency (RF) swing.

In one example, the method may further comprise the bias generator block providing a constant voltage to the power amplifier block.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments described herein are directed to an amplifier circuit for providing optimal bias over a wide battery voltage ($V_{cc}$) range, maintain a constant quiescent current over a $V_{cc}$ range, and tailoring for process variation.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1:
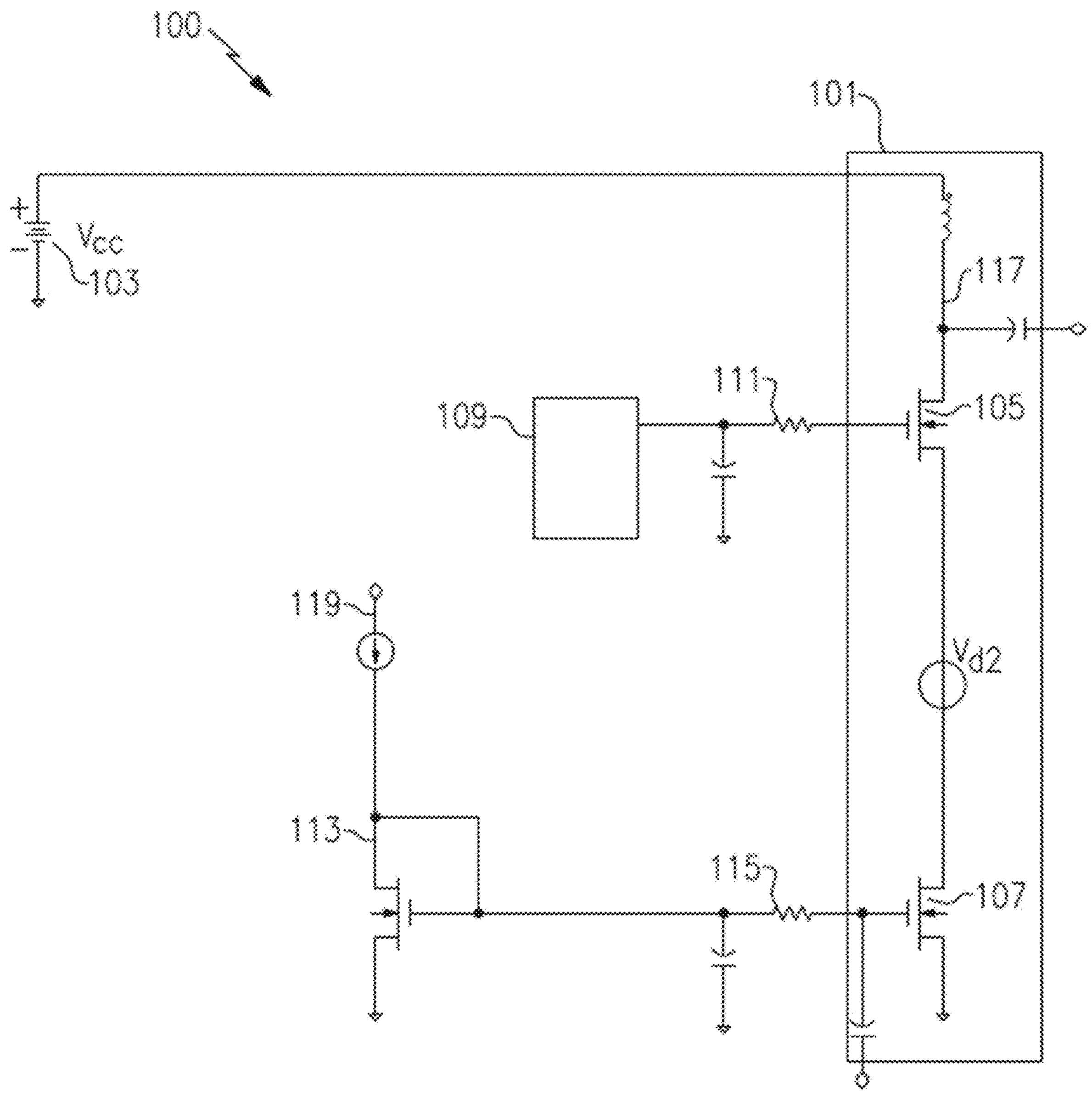
FIG. 1 is a circuit diagram of a cascode amplifier circuit according to the prior art.

As described in relation to FIG. 1, existing cascode amplifier circuits according to the prior art suffer from a large variation of current across a range of battery voltages, and cannot eliminate process variation.

Advantageously, embodiments described herein provide circuits and/or methods for maintaining quiescent current across $V_{cc}$ range as well as tailoring for process variation. In more detail, embodiments described herein implement operational amplifiers (OPAMPS) and a duplicated cascode circuit to provide optimal bias over a wide $V_{cc}$ range. Optimal bias may non-exhaustively be in terms of efficiency, linearity, and current. In some embodiments, a first OPAMP is implemented to adjust gate bias to maintain a constant DC quiescent current over a $V_{cc}$ range, and a second OPAMP is implemented with a cascode bias generator to adjust the cascode voltage to the optimum point and reduce voltage variation arising from process variation.

Figure 2:
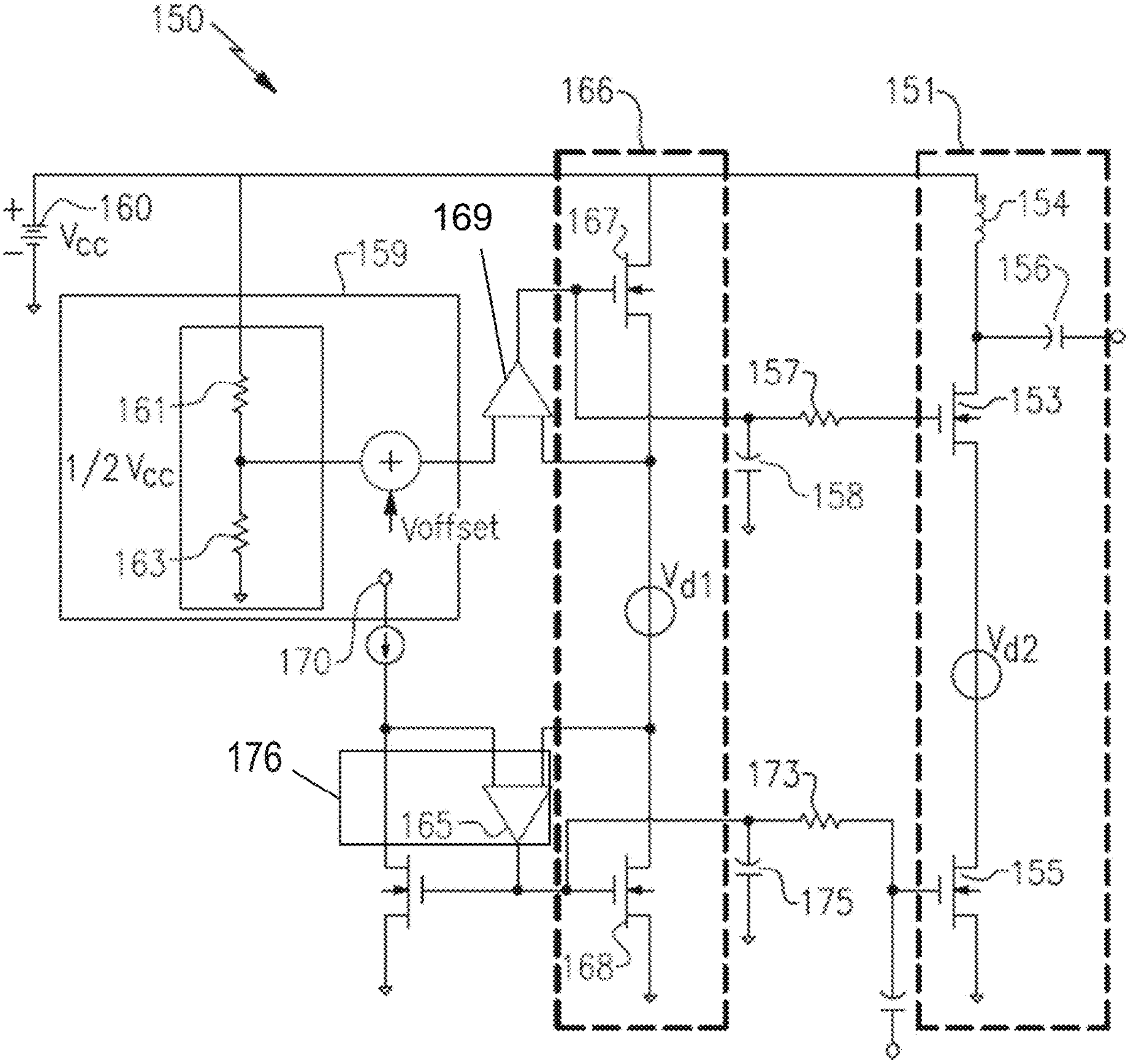
FIG. 2 is a circuit diagram of a cascode amplifier circuit according to aspects of the present invention.

FIG. 2 illustrates an amplifier circuit 150 according to embodiments of the present disclosure. The amplifier circuit 150 in this example is a cascode amplifier circuit 150 for a CMOS amplifier. The amplifier circuit 150 comprises a first power amplifier block 151 including a first transistor 153 and a second transistor 155. The power amplifier block 151 also comprises a matching circuit, which in this example comprises an inductor 154 and capacitor 156. It will be appreciated that such a matching circuit is only exemplary and any suitable matching circuit may be implemented.

The amplifier circuit 150 also comprises a bias generator block 159, which in this example is a cascode bias generator circuit configured to provide a reference voltage to the power amplifier block 151. The bias generator block 159 is configured to receive an input voltage $V_{cc}$ from, in this example, a battery voltage source 160. The bias generator block 159 processes the received voltage $V_{cc}$, and outputs a reference voltage $V_{ref}$. In this example, the bias generator block 159 comprises resistors 161 and 163, and the bias generator block 159 halves the received battery voltage $V_{cc}$. The bias generator block 159 also comprises an adder for adding an offset voltage to the halved $V_{cc}$. Therefore, the output of the bias generator block corresponding to the reference voltage $V_{ref}$ is half $V_{cc}$ plus the offset voltage. If the bias generator did not include the voltage offset adder, the reference voltage would be half of $V_{cc}$. It will be appreciated by those skilled in the art that this is an example bias generator block, and any suitable bias generator can be used.

The amplifier circuit 150 also comprises a current control block 176 coupled to the second transistor of the power amplifier block 151. As will be described in more detail below, the current control block 176 is configured to adjust a gate bias to the second transistor in order to maintain quiescent current.

The second transistor 155 corresponds to the $g_m$ (transconductance) core. Control of the gate voltage to the second transistor 155 increases or decreases the DC current to the power amplifier core. However, the drain voltage $V_{d2}$ between the first and second transistors is unknown. This voltage source drain is a function of the characteristics of the first transistor 153, the resistor 157, and the capacitor 158, as well as the voltages at the gates of the first and second transistors. It is desirable to be able to control this voltage source drain. This is particularly advantageous in CMOS amplifiers, which have relatively large current variation with drain voltage. Embodiments of the present invention allow accurate control of the voltage source drain $V_{d2}$.

In some embodiments, the amplifier circuit 150 comprises one power amplifier block 151, corresponding to one amplification step. However, in some embodiments it may be advantageous to have multiple amplification steps. For example, CMOS amplifiers typically have limited capability with respect to voltage swing. In order to withstand a larger voltage swing and to provide a more stable power amplifier, the CMOS amplifier according to embodiments of the present invention implements multiple amplifier steps. In this example, the amplifier circuit 150 comprises two steps including the power amplifier block 151 and a duplicated power amplifier block.

That is, in some embodiments, the power amplifier block 151 is a first power amplifier block, and the amplifier circuit 150 comprises a second power amplifier block 166. The second power amplifier block 166 comprises a third transistor 167 and a fourth transistor 168. The bias generator block 159 is coupled to the third transistor and provides the output voltage (or reference voltage) to the third transistor 167 as well as the first transistor 153.

The amplifier circuit 150 further comprises a current control block 176 coupled to the fourth transistor 168 as well as the second transistor 155. The current control block 176 is configured to adjust a gate bias to the fourth transistor based on a voltage drain source $V_{d1}$ between the third transistor 167 and the fourth transistor 168.

In order to accurately control the voltage drain source $V_{d1}$ and the voltage drain source $V_{d2}$, the bias generator block 159 is coupled to the first transistor 153 of the power amplifier block 151 and the third transistor 167 of the second power amplifier block 166 via an operational amplifier. Specifically, the operational amplifier comprises a comparator 169. The comparator 169 receives the output (the reference voltage) from the bias generator block 159 and compares the received voltage with the voltage drain source $V_{d1}$ between the third transistor 167 and the fourth transistor 168. Based on the comparison, the operational amplifier adjusts the gate voltage provided to the first transistor 153 and the third transistor 167 in order to make the drain source voltage $V_{d1}$ and the drain source voltage $V_{d2}$ equal to the reference voltage. In this way, advantageously, the drain source voltages can be accurately controlled.

The current control block 176 is coupled to the second transistor 155 and the fourth transistor 168 via another operational amplifier. In this example, the operational amplifier comprises a comparator 165 configured to compare the drain voltage between the third transistor 167 and the fourth transistor 168 with a quiescent voltage provided to the current control block 176 by a current source 170. The operational amplifier coupled to the current control block 176 advantageously maintains precise control of quiescent current regardless of process variation.

In addition to the multiple amplification steps, to better account for voltage swing, in some embodiments, the bias generator block 159 is coupled to the first transistor 153 via a first resistor 157, and the current control block 176 is coupled to the second transistor 155 via a second resistor 173. The resistors 157, 173 act to prevent voltage swing arising from the voltage source to the gate of the first and second transistors, and capacitors 158 and 175 act to kill the voltage swing.

While in this described embodiment, the bias generator block 159 receives and processes the received battery voltage, it will be appreciated that the voltage provided to the first and third transistors may be provided by a constant voltage source.

Thus, embodiments of the present disclosure provide accurate control of drain source voltages at the power amplifier blocks while maintaining constant quiescent current and accounting for process variation.

Figure 3:
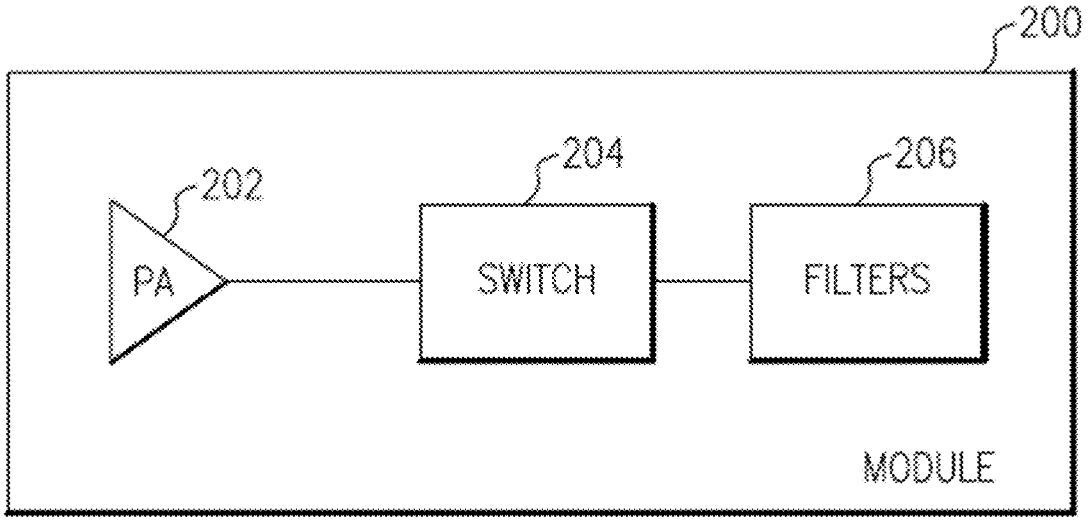
FIG. 3 is a schematic block diagram of a module that includes a cascode amplifier circuit according to aspects of the present invention, a switch, and filters.

FIG. 3 is a schematic block diagram of a module 200 such as a radio frequency module that includes a power amplifier 202 including the amplifier circuit 150 in accordance with one or more embodiments described herein having associated advantages as described herein, a switch 204, and filters 206.

The module 200 can include a package that encloses the illustrated elements. The power amplifier 202, the switch 204, and the filters 206 can be disposed on a common packaging substrate. The packaging substrate can be a laminate substrate, for example. The power amplifier 202 can amplify a radio frequency signal. The power amplifier 202 can include a gallium arsenide bipolar transistor in certain applications. The switch 204 can be a multi-throw radio frequency switch. The switch 204 can electrically couple an output of the power amplifier 202 to a selected filter of the filters 206. The filters 206 can include any suitable number of surface acoustic wave filters and/or other acoustic wave filters. One or more of the surface acoustic wave filters of the filters 206 can be implemented in accordance with any suitable principles.

Figure 4:
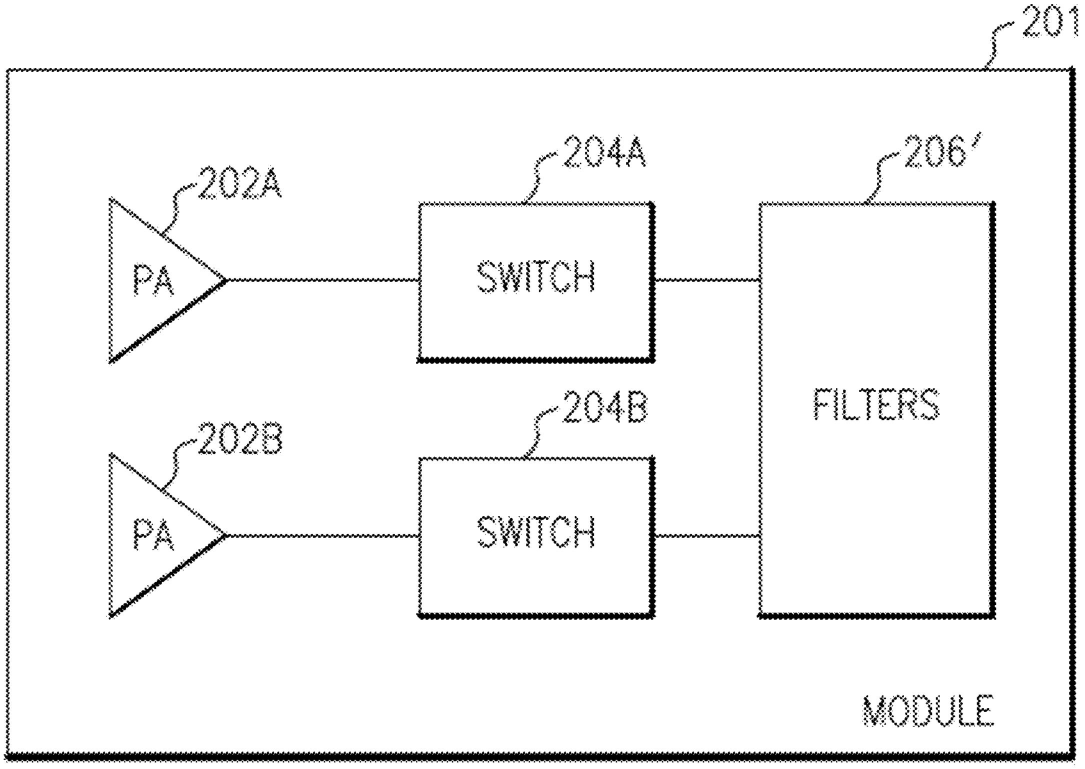
FIG. 4 is a schematic block diagram of a module that includes cascode amplifier circuits according to aspects of the present invention, switches, and filters.

FIG. 4 is a schematic block diagram of a module 201 such as a radio frequency module that includes power amplifiers 202A and 202B, one or both of the power amplifiers including an amplifier circuit in accordance with one or more embodiments described herein, switches 204A and 204B, and filters 206'. The module 201 is like the module 200 of FIG. 3, except that the module 201 includes an additional power amplifier 202B and an additional switch 204B and the filters 206' are arranged to filter signals for the signals paths associated with a plurality of power amplifiers 202A and 202B. The different signal paths can be associated with different frequency bands and/or different modes of operation (e.g. different power modes, different signaling modes, etc.).

Figure 5:
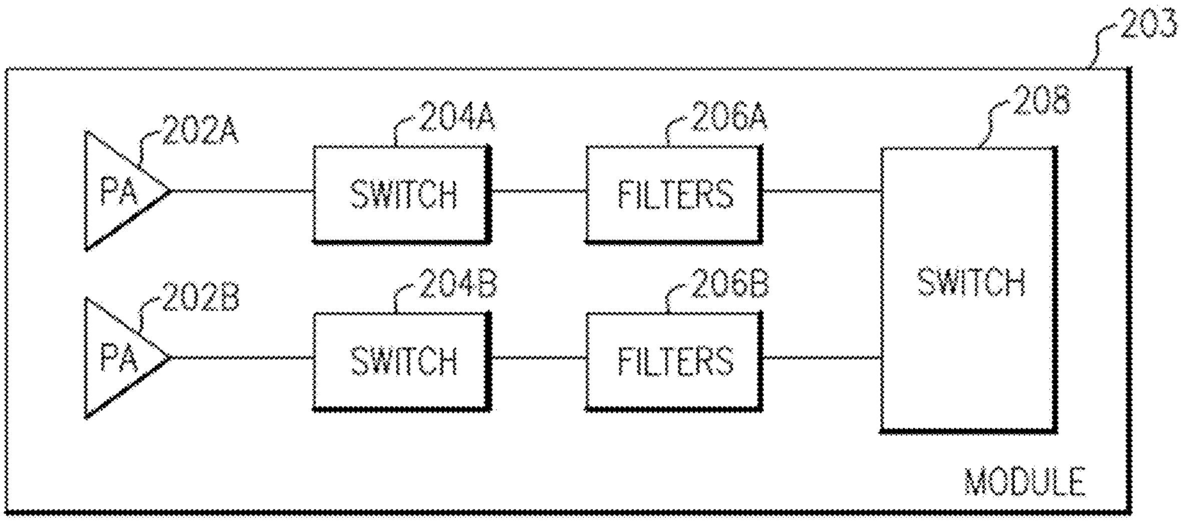
FIG. 5 is a schematic block diagram of a module that includes cascode amplifier circuits according to aspects of the present invention, switches, and filters.

FIG. 5 is a schematic block diagram of a module 203 such as a radio frequency module that includes power amplifiers 202A and 202B, one or both of the power amplifiers including an amplifier circuit in accordance with one or more embodiments described herein, more switches 204A and 204B, filters 206A and 206B, and an antenna switch 208. The module 203 is like the module 201 of FIG. 4, except the module 203 includes an antenna switch 208 arranged to selectively couple a signal from the filters 206A or the filters 206B to an antenna node. The filters 206A and 206B can correspond to the filters 206' of FIG. 4.

Figure 6:
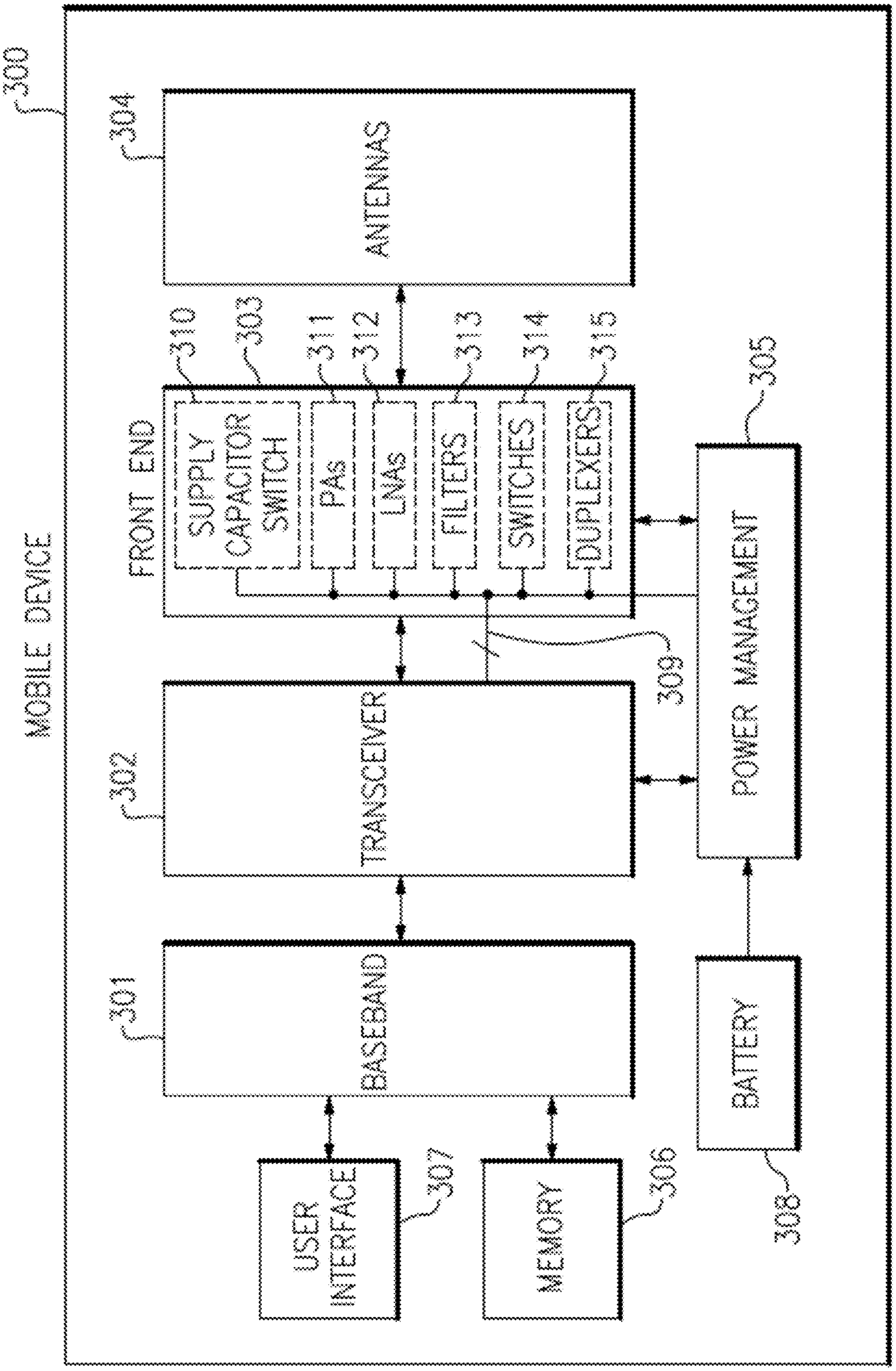
FIG. 6 is a schematic diagram of one embodiment of a wireless communication device.

FIG. 6 is a schematic diagram of one embodiment of a wireless communication device such as a mobile device 300. The mobile device 300 includes a baseband system 301, a transceiver 302, a front end system 303, antennas 304, a power management system 305, a memory 306, a user interface 307, and a battery 308.

Although the mobile device 300 illustrates one example of an RF system that can include one or more features of the present disclosure, the teachings herein are applicable to electronic systems implemented in a wide variety of ways.

The mobile device 300 can be used to communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 302 generates RF signals for transmission and processes incoming RF signals received from the antennas 304. It will be understood that various functionalities associated with the transmission and receiving of RF signals can be achieved by one or more components that are collectively represented in FIG. 6 as the transceiver 302. In one example, separate components (for instance, separate circuits or dies) can be provided for handling certain types of RF signals.

As shown in in FIG. 6, the transceiver 302 is connected to the front end system 303 and to the power management circuit 305 using a serial interface 309. All or part of the illustrated RF components can be controlled by the serial interface 309 to configure the mobile device 300 during initialization and/or while fully operational. In another embodiment, the baseband processor 301 is additionally or alternative connected to the serial interface 309 and operates to configure one or more RF components, such as components of the front end system 303 and/or power management system 305.

The front end system 303 aids in conditioning signals transmitted to and/or received from the antennas 304. In the illustrated embodiment, the front end system 303 includes one or more bias control circuits 310 for controlling power amplifier biasing, one or more power amplifiers (PAs) 311 including one or more amplifier circuits in accordance with one or more embodiments described herein, one or more low noise amplifiers (LNAs) 312, one or more filters 313, one or more switches 314, and one or more duplexers 315. However, other implementations are possible.

For example, the front end system 303 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 300 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 304 can include antennas used for a wide variety of types of communications. For example, the antennas 304 can include antennas for transmitting and/or receiving signals associated with a wide variety of frequencies and communications standards.

In certain implementations, the antennas 304 support multiple-input and multiple-output (MIMO) communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 300 can operate with beamforming in certain implementations. For example, the front end system 303 can include phase shifters having variable phase controlled by the transceiver 302. Additionally, the phase shifters are controlled to provide beam formation and directivity for transmission and/or reception of signals using the antennas 304. For example, in the context of signal transmission, the phases of the transmit signals provided to the antennas 304 are controlled such that radiated signals from the antennas 304 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 304 from a particular direction. In certain implementations, the antennas 304 include one or more arrays of antenna elements to enhance beamforming.

The baseband system 301 is coupled to the user interface 307 to facilitate processing of various user input and output (I/O), such as voice and data. The baseband system 301 provides the transceiver 302 with digital representations of transmit signals, which the transceiver 302 processes to generate RF signals for transmission. The baseband system 301 also processes digital representations of received signals provided by the transceiver 302. As shown in FIG. 6, the baseband system 301 is coupled to the memory 306 to facilitate operation of the mobile device 300.

The memory 306 can be used for a wide variety of purposes, such as storing data and/or instructions to facilitate the operation of the mobile device 300 and/or to provide storage of user information.

The power management system 305 provides a number of power management functions of the mobile device 300. In certain implementations, the power management system 305 includes a power amplifier (PA) supply control circuit that controls the supply voltages of the power amplifiers 311. For example, the power management system 305 can be configured to change the supply voltage(s) provided to one or more of the power amplifiers 311 to improve efficiency, such as power added efficiency (PAE).

The power management system 305 can operate in a selectable supply control mode, such an average power tracking (APT) mode or an envelope tracking (ET) mode. In the illustrated embodiment, the selected supply control mode of the power management system 305 is controlled by the transceiver 302. In certain implementations, the transceiver 302 controls the selected supply control mode using the serial interface 309.

As shown in FIG. 6, the power management system 305 receives a battery voltage from the battery 308. The battery 308 can be any suitable battery for use in the mobile device 300, including, for example, a lithium-ion battery. Although the power management system 305 is illustrated as separate from the front end system 303, in certain implementations all or part (for instance, a PA supply control circuit) of the power management system 305 is integrated into the front end system 303.

Figure 7:
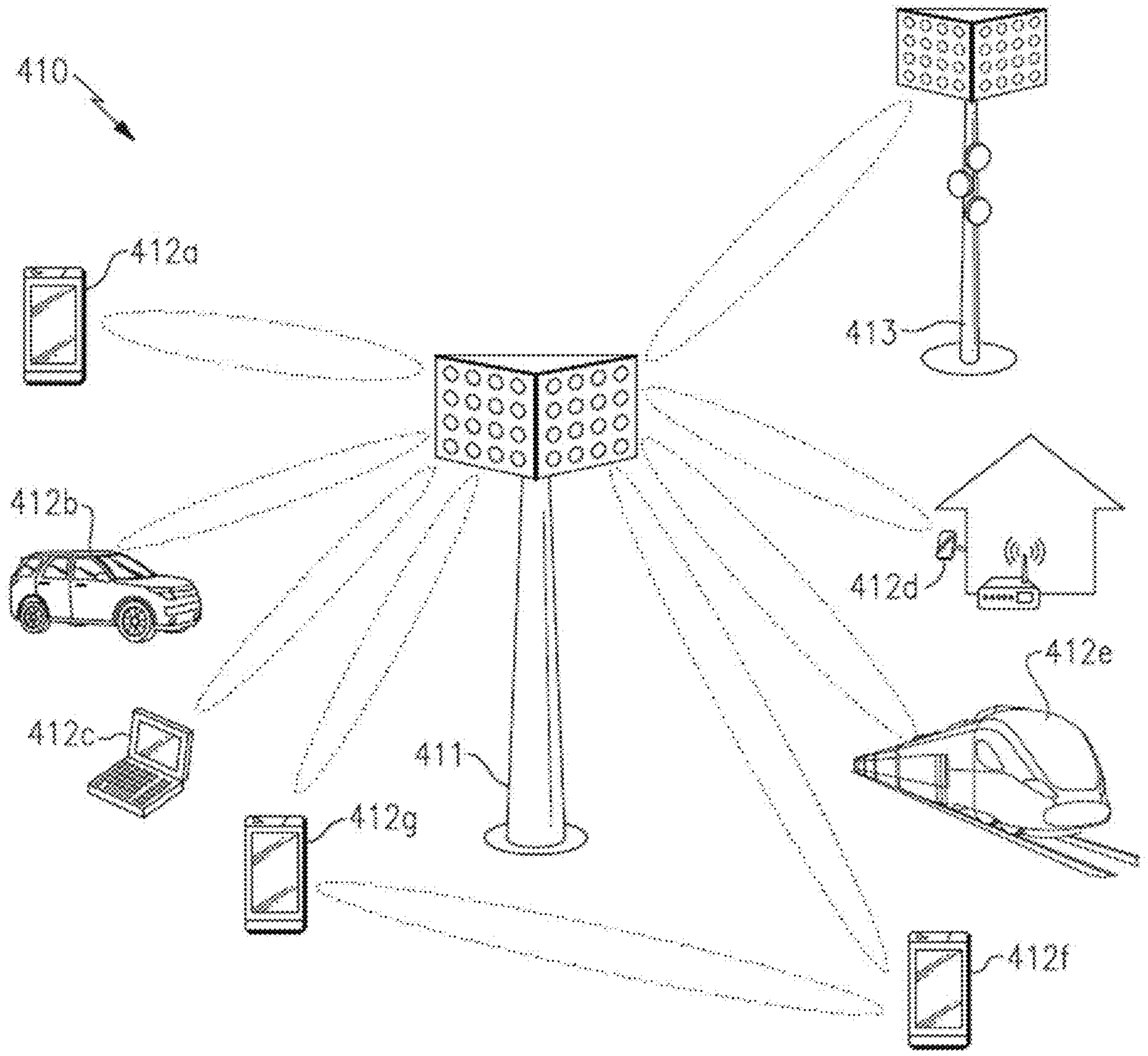
FIG. 7 is a schematic diagram of one example of a communication network.

FIG. 7 is a schematic diagram of one example of a communication network 410. The communication network 410 includes a macro cell base station 411, a small cell base station 413, and various examples of user equipment (UE), including a first mobile device 412*a*, a wireless-connected car 412*b*, a laptop 412*c*, a stationary wireless device 412*d*, a wireless-connected train 412*e*, a second mobile device 412*f*, and a third mobile device 412*g*. UEs are wireless communication devices. One or more of the macro cell base station 411, the small cell base station 413, or UEs illustrated in FIG. 7 can implement one or more of the amplifier circuits in accordance with any suitable principles and advantages disclosed herein. For example, one or more of the UEs shown in FIG. 7 can include one or more amplifier circuits in accordance with any suitable principles and advantages disclosed herein, and may include any of the amplifier circuits shown and described with respect to FIGS. 2-6, or can include any of the modules or systems including such amplifier circuits.

Although specific examples of base stations and user equipment are illustrated in FIG. 7, a communication network can include base stations and user equipment of a wide variety of types and/or numbers. For instance, in the example shown, the communication network 410 includes the macro cell base station 411 and the small cell base station 413. The small cell base station 413 can operate with relatively lower power, shorter range, and/or with fewer concurrent users relative to the macro cell base station 411. The small cell base station 413 can also be referred to as a femtocell, a picocell, or a microcell. Although the communication network 410 is illustrated as including two base stations, the communication network 410 can be implemented to include more or fewer base stations and/or base stations of other types.

Although various examples of user equipment are shown, the teachings herein are applicable to a wide variety of user equipment, including, but not limited to, mobile phones, tablets, laptops, Internet of Things (IoT) devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 410 of FIG. 7 supports communications using a variety of cellular technologies, including, for example, 4G LTE and 5G NR. In certain implementations, the communication network 410 is further adapted to provide a wireless local area network (WLAN), such as WiFi. Although various examples of communication technologies have been provided, the communication network 410 can be adapted to support a wide variety of communication technologies.

Various communication links of the communication network 410 have been depicted in FIG. 7. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 7, the communication links include not only communication links between UE and base stations, but also UE to UE communications and base station to base station communications. For example, the communication network 410 can be implemented to support self-fronthaul and/or self-backhaul (for instance, as between mobile device 412*g* and mobile device 412*f*).

The communication links can operate over a wide variety of frequencies. In certain implementations, communications are supported using 5G NR technology over one or more frequency bands that are less than 6 GHz and/or over one or more frequency bands that are greater than 6 GHz. According to certain implementations, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 410 can share available network resources, such as available frequency spectrum, in a wide variety of ways. In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 3 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 410 of FIG. 7 can be used to support a wide variety of advanced communication features, including, but not limited to, eMBB, uRLLC, and/or mMTC.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 5 GHz, in a frequency range from about 400 MHz to 8.5 GHz or in FR1.

Aspects of this disclosure can be implemented in various electronic devices. Examples of the electronic devices can include, but are not limited to, consumer electronic products, parts of the consumer electronic products such as semiconductor die and/or packaged radio frequency modules, electronic test equipment, uplink wireless communication devices, personal area network communication devices, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A cascode amplifier circuit comprising:
- a first power amplifier block having a first transistor and a second transistor;
- a second power amplifier block having a third transistor and a fourth transistor;
- a bias generator block coupled to the first transistor and the third transistor via a first comparator and being configured to provide a reference voltage to the first and second power amplifier blocks; and
- a current control block coupled to the second transistor and the fourth transistor via a second comparator configured to compare a first drain voltage between the third and fourth transistors with a quiescent voltage provided to the current control block, and to adjust a gate voltage to the second and fourth transistors based on the comparison to maintain a constant quiescent current, the first comparator configured to compare the reference voltage with the first drain voltage, and to adjust a gate voltage provided to the first and third transistors to make the drain voltage between the third and fourth transistors and a second drain voltage between the first and second transistors equal to the reference voltage, the bias generator block coupled to the first transistor via a first resistor, and the current control block coupled to the second transistor via a second resistor, and the first and second resistors being configured to prevent radio frequency swing.

2. The cascode amplifier circuit of claim 1 wherein the bias generator block is a cascode bias generator block and is configured to: receive an input voltage; process the input voltage; and provide the reference voltage based on the processed input voltage.

3. The cascode amplifier circuit of claim 2 wherein the cascode bias generator circuit further includes an adder configured to add an offset voltage when processing the input voltage.

4. The cascode amplifier circuit of claim 1 wherein the first power amplifier block includes a matching circuit.

5. The cascode amplifier circuit of claim 1 wherein the bias generator block includes a constant voltage source configured to provide a constant voltage to the first power amplifier block.

6. A radio frequency module comprising:

a cascode amplifier circuit including: a first power amplifier block configured to provide a radio frequency signal and including a first transistor and a second transistor; a second power amplifier block having a third transistor and a fourth transistor; a bias generator block coupled to the first transistor and the third transistor via a first comparator and being configured to provide a reference voltage to the first and second power amplifier blocks; and a current control block coupled to the second transistor and the fourth transistor via a second comparator configured to compare a first drain voltage between the third and fourth transistors with a quiescent voltage provided to the current control block, and to adjust a gate voltage to the second and fourth transistors based on the comparison to maintain a constant quiescent current, the first comparator configured to compare the reference voltage with the first drain voltage, and to adjust a gate voltage provided to the first and third transistors to make the drain voltage between the third and fourth transistors and a second drain voltage between the first and second transistors equal to the reference voltage, the bias generator block coupled to the first transistor via a first resistor, and the current control block coupled to the second transistor via a second resistor, and the first and second resistors being configured to prevent radio frequency swing; and a filter configured to filter the radio frequency signal.

7. A wireless communication device comprising:

a cascode amplifier circuit including: a first power amplifier block configured to provide a radio frequency signal and including a first transistor and a second transistor; a second power amplifier block having a third transistor and a fourth transistor; a bias generator block coupled to the first transistor and the third transistor via a first comparator and being configured to provide a reference voltage to the first and second power amplifier blocks; and a current control block coupled to the second transistor and the fourth transistor via a second comparator configured to compare a first drain voltage between the third and fourth transistors with a quiescent voltage provided to the current control block, and to adjust a gate voltage to the second and fourth transistors based on the comparison to maintain a constant quiescent current, the first comparator configured to compare the reference voltage with the first drain voltage, and to adjust a gate voltage provided to the first and third transistors to make the drain voltage between the third and fourth transistors and a second drain voltage between the first and second transistors equal to the reference voltage, the bias generator block coupled to the first transistor via a first resistor, and the current control block coupled to the second transistor via a second resistor, and the first and second resistors being configured to prevent radio frequency swing;

a filter configured to filter the radio frequency signal; and an antenna configured to transmit the filtered radio frequency signal.

8. The radio frequency module of claim 6 wherein the bias generator block is a cascode bias generator block and is configured to: receive an input voltage; process the input voltage; and provide the reference voltage based on the processed input voltage.

9. The radio frequency module of claim 8 wherein the cascode bias generator circuit further includes an adder configured to add an offset voltage when processing the input voltage.

10. The radio frequency module of claim 6 wherein the first power amplifier block includes a matching circuit.

11. The radio frequency module of circuit of claim 6 wherein the bias generator block includes a constant voltage source configured to provide a constant voltage to the first power amplifier block.

12. The wireless communication device of claim 7 wherein the bias generator block is a cascode bias generator block and is configured to: receive an input voltage; process the input voltage; and provide the reference voltage based on the processed input voltage.

13. The wireless communication device of claim 12 wherein the cascode bias generator circuit further includes an adder configured to add an offset voltage when processing the input voltage.

14. The wireless communication device of claim 7 wherein the first power amplifier block includes a matching circuit.

15. The wireless communication device of claim 7 wherein the bias generator block includes a constant voltage source configured to provide a constant voltage to the first power amplifier block.

16. The cascode amplifier circuit of claim 1 wherein matching circuit includes an inductor and a capacitor.

17. The radio frequency module of claim 6 wherein matching circuit includes an inductor and a capacitor.

18. The radio frequency module of claim 6 further comprising a filter and a switch, the switch positioned between the cascode amplifier circuit and the filter.

19. The wireless communication device of claim 7 wherein matching circuit includes an inductor and a capacitor.

20. The wireless communication device of claim 7 further comprising a switch positioned between the cascode amplifier circuit and the filter.

* * * * *